(12) United States Patent
Wakata et al.

(10) Patent No.: US 6,808,841 B2
(45) Date of Patent: Oct. 26, 2004

(54) BATTERY TERMINAL UNIT PROVIDED WITH A CURRENT SENSOR

(75) Inventors: Shigekazu Wakata, Yokkaichi (JP); Masanori Wakui, Toyota (JP); Hisao Niwa, Toyota (JP); Naohiko Suzuki, Toyota (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 535 days.

(21) Appl. No.: 09/999,126

(22) Filed: Oct. 31, 2001

(65) Prior Publication Data

US 2002/0051907 A1 May 2, 2002

(30) Foreign Application Priority Data

Nov. 1, 2000 (JP) ........................................ 2000-334858

(51) Int. Cl.⁷ .............................................. H01M 10/48
(52) U.S. Cl. .............................. 429/91; 429/91; 429/61
(58) Field of Search ............................... 429/61, 90, 91

(56) References Cited

U.S. PATENT DOCUMENTS

| 2,072,915 A | * | 3/1937 | Bernhard et al. | ............. 429/50 |
| 2,072,916 A | * | 3/1937 | Bernhard et al. | ............. 73/438 |
| 4,675,255 A | * | 6/1987 | Pfeifer et al. | ................. 429/92 |
| 5,378,554 A | * | 1/1995 | Moses | .......................... 429/97 |
| 5,532,573 A | * | 7/1996 | Brown et al. | ................. 322/22 |

FOREIGN PATENT DOCUMENTS

| FR | 2 293 073 | 6/1976 |
| FR | 2 702 310 | 9/1994 |
| JP | 2-74762 | 3/1990 |
| JP | 7-122260 | 5/1995 |

* cited by examiner

*Primary Examiner*—Randy Gulakowski
*Assistant Examiner*—Saeed Chaudhry
(74) *Attorney, Agent, or Firm*—Gerald E. Hespos; Anthony J. Casella

(57) ABSTRACT

A terminal unit (TU) includes a battery terminal (2) mounted at the leading end of a wiring harness (4), and a holder (8) mounted on the wiring harness (4) at a position distanced from the battery terminal (2). A current sensor (12) is transported separately from the terminal unit (TU) to a connection site to a battery (B). The battery terminal (2) is introduced through the current sensor (12) and the current sensor (12) then is coupled with the holder (8) at the connection site. This operation is performed at a position distanced from the battery (B), and hence can be performed smoothly without being hindered.

17 Claims, 3 Drawing Sheets

US 6,808,841 B2

BATTERY TERMINAL UNIT PROVIDED WITH A CURRENT SENSOR

BACKGROUND OF THE INVENTION

1. Field of the Invention

The present invention relates to a battery terminal unit to be provided with a current sensor.

2. Detailed Description of the Related Art

The kinds and the number of electric parts of a vehicle continually increase. Accordingly, electric energy produced by a vehicle battery is exhausted more quickly, and the remaining capacity of the battery should be monitored.

A current sensor may be mounted on a battery post to detect the intensity of the current and hence to determine the extent of exhaustion of the battery. However, there is insufficient space to mount the current sensor around the battery post of the existing battery. The current sensor could be mounted on a wiring harness that is to be connected with battery post. However, a current sensor mounted on the wiring harness can be struck and broken during normal handling of the wiring harness.

The present invention was developed in view of the above situation and an object of the invention is to provide a battery terminal unit with a current sensor that can be mounted easily and that is not likely to be broken.

SUMMARY OF THE INVENTION

The invention is directed to a battery terminal assembly with a current sensor. The battery terminal assembly comprises a wire or wiring harness. A battery terminal is provided at a leading end of the wire or wiring harness and has a terminal portion configured for connection with a battery post. A holder is mounted or mountable on the wiring harness or on the battery terminal at a position spaced from the terminal portion, and a current sensor preferably is mounted later on the holder of the battery terminal assembly. The holder may be a bottomed ring.

The holder preferably is spaced from the terminal portion of the battery terminal by a distance sufficient for a tightening means of the battery terminal to be tightened so that the battery terminal can be connected to the external battery post. Therefore, the current sensor can be mounted smoothly without being hindered by the battery or structures around the battery.

The current sensor preferably is connected with the wiring harness at a connection site to a battery. Therefore, the current sensor will not be damaged while the wiring harness is being handled.

The holder preferably is substantially ring-shaped and is mounted by introducing the wire or wiring harness therethrough. The current sensor may be coupled to the holder after introducing the terminal portion of the battery terminal through the current sensor. Accordingly, the battery terminal need not be formed with a special portion for mounting the holder, and the battery terminal may have a known construction.

The battery terminal may comprise a holder mount portion extending from the terminal portion for connection with the wire or wiring harness. The holder is mounted on the holder mount portion at a position spaced from the terminal portion, and the current sensor may be coupled to the holder after introducing the terminal portion of the battery terminal through the holder.

The holder may be formed by two half-pieces that can be arranged on the wire, wiring harness or battery terminal and then fixed to each other. Alternatively, the holder may be formed by insert-molding the holder on the holder mount portion.

The current sensor is mounted onto the holder by a sensor portion with a locking means that cooperates with mating locking means of the holder.

The battery terminal preferably comprises a barrel for connection with the wire or wiring harness preferably by crimping.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
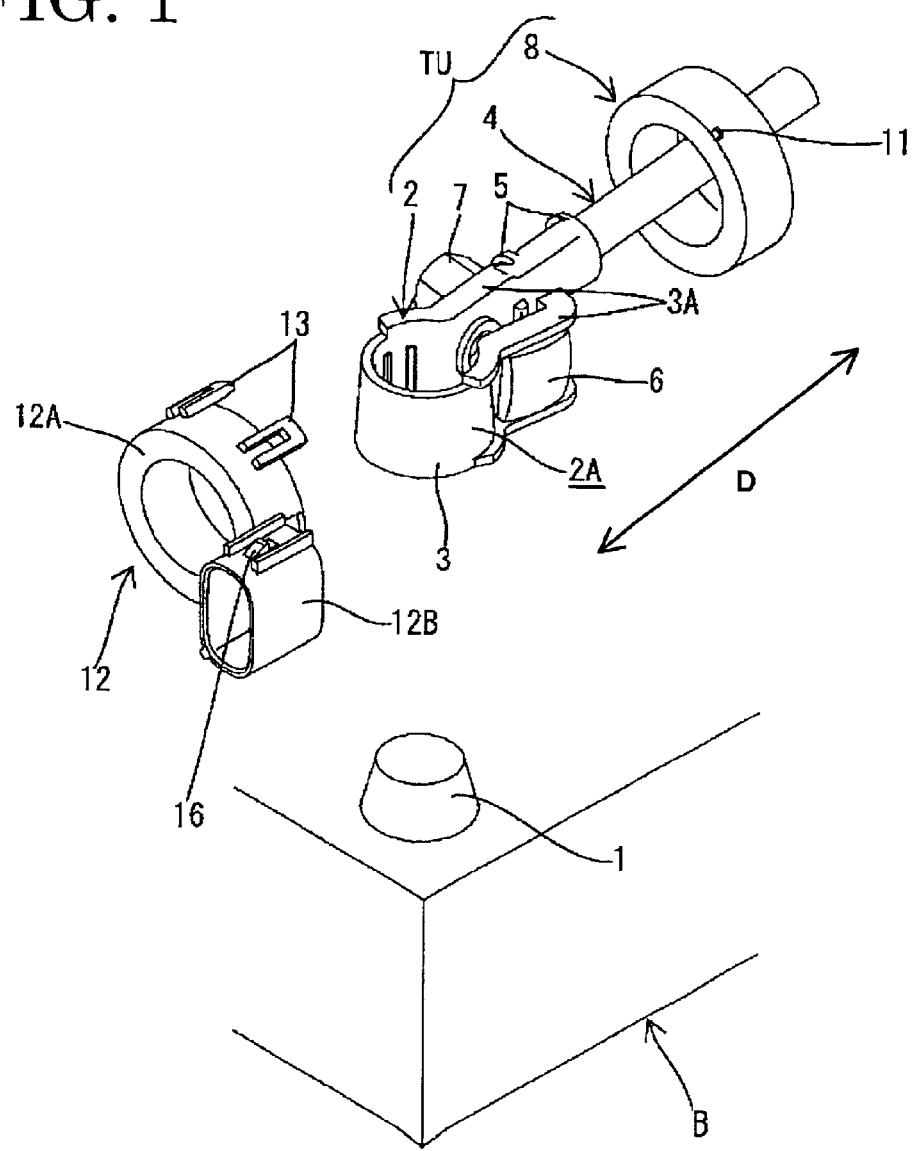
FIG. 1 is an exploded perspective view of a first embodiment.
Figure 2:
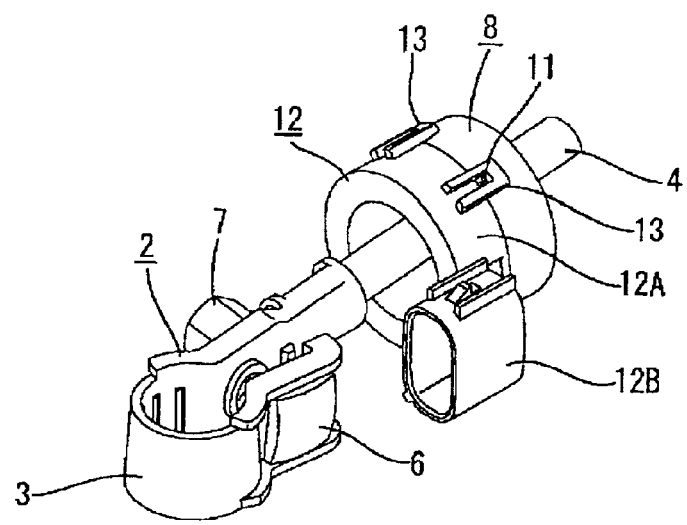
FIG. 2 is a perspective view showing a state where a current sensor is mounted on a terminal unit.

The letter B in FIG. 1 identifies a battery for an automotive vehicle. Two battery posts 1 extend from a surface of the battery B (only one battery post is shown in FIG. 1). Each battery post 1 is in the formed of a truncated cone that is tapered slightly toward the top and a battery terminal 2 is to be connected with the battery post 1.

The battery terminal 2 has a known construction. Specifically, the battery terminal 2 is formed by bending an electrically conductive metallic plate to define a terminal portion 2A that can be connected with the battery post 1. The terminal portion 2A has a fastening ring 3 to be fastened around the battery post 1. The fastening ring 3 is configured to fit closely on the outer circumferential surface of the battery post 1 and is open upward and downward along a fitting direction of the battery terminal 2 onto the respective battery post 1. Opposite ends of the fastening ring 3 extend sideways and substantially oppose each other to form opposed walls 3A. A clamp bolt 6 penetrates between and through the opposed walls 3A. The clamp bolt 6 has a polygonal head that is engageable with upper and lower edges of one of the opposed walls 3A to prevent turning. A nut 7 can be threaded to an end of the shaft of the clamp bolt 6. The opposed walls 3A are brought closer to each other by tightening the clamp bolt 6 and the nut 7, thereby causing the fastening ring 3 to bite into the battery post 1.

The other opposed wall 3A extends further backward to become a barrel 5 for connection with a wiring harness 4. Although not shown in detail, the barrel 5 includes a portion to be crimped into connection with a core exposed by stripping the leading end of the wiring harness 4 and a portion to be crimped into connection with an insulation coating of the wiring harness 4.

Figure 3:
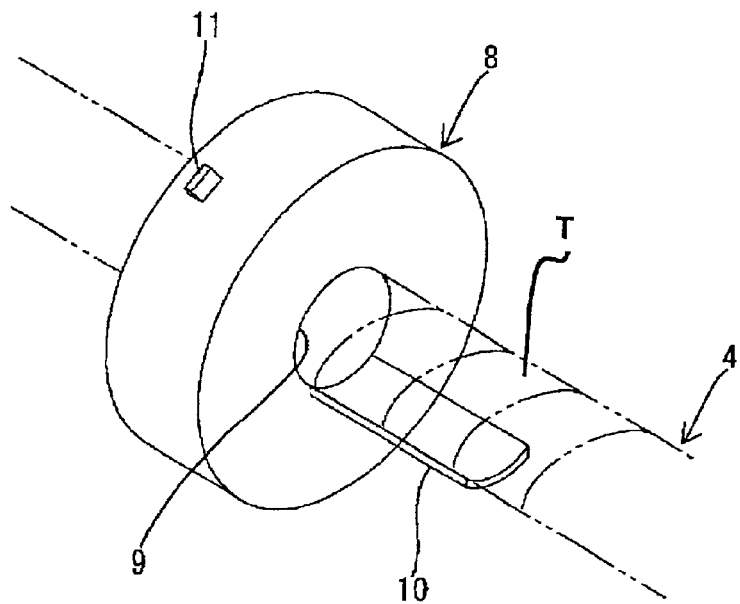
FIG. 3 is a perspective view showing a state where a holder is mounted on a wiring harness.

A holder 8 in the form of a bottomed ring is provided at an intermediate position of the wiring harness 4 spaced from the battery terminal 2 by a specified distance D. The distance D is selected so that a tool does not interfere when the nut 7 is tightened. The holder 8 is made e.g. of a synthetic resin, and an insertion hole 9 is formed in the center of its bottom wall for permitting the insertion of the wiring harness 4. A receiving piece 10 extends outward along the longitudinal direction at the opening edge of the insertion hole 9, as shown in FIG. 3. The wiring harness 4 is fixed, preferably by tape T, while supported on the receiving portion 10. In this way, a terminal unit TU is constructed in which the holder 8 is assembled with the wiring harness 4 connected with the battery terminal 2. Locking projections 11 are formed at suitable intervals on the outer circumferential surface of the holder 8 near one of its edges.

A current sensor 12 includes a sensor portion 12A with an unillustrated built-in detector that uses, for example, a Hall device or the like for detecting a current supplied from the battery B to a load connected with the wiring harness 4. The current sensor 12 also includes a connector portion 12B that projects integrally or unitarily from one side of the sensor portion 12A. The ring-shaped detector can be embedded in the sensor portion 12A by insert molding of a synthetic resin. Further, the sensor portion 12A is formed such that the battery terminal 2 can be fit sideways through the sensor portion 12A. Locking pieces 13 are provided on the outer circumferential surface of the sensor portion 12A and substantially correspond to the respective locking projections 11 of the holder 8. The locking pieces 13 are substantially U-shaped, and extend toward the holder 8. When the holder 8 and the sensor portion 12A are aligned and put together, the locking projections 11 fit inside the corresponding locking pieces 13. In this way, the current sensor 12 can be mounted on the terminal unit TU.

The connector portion 12B is molded integrally or unitarily at one side of the sensor portion 12A and has a tubular shape that is open at one end. A terminal fitting connected with the ring-shaped detector is mountable in the open end of the connector portion 12B. The connector portion 12B can be fitted to a mating connector that is connected with an unillustrated current detecting circuit to enable terminal fittings mounted inside to be electrically connected with each other. A locking claw 16 projects from a side surface of the connector portion 12B for holding the connector portion 12B connected with the mating connector.

The terminal unit TU, including the holder 8 and the current sensor 12, are transported to a connection site where they are connected with a battery. At the connection site, the sensor portion 12A of the current sensor 12 is fitted on the battery terminal 2, and the holder 8 and the sensor portion 12A are aligned and then put together. The current sensor 12 is mounted on the holder 8 by engaging the respective locking pieces 13 with the corresponding locking projections 11. The fastening ring 3 of the battery terminal 2 then is fitted to the battery post 1 and the clamp bolt 6 is tightened. As a result, the inner circumferential surface of the fastening ring 3 engages and preferably bites into the battery post 1 to complete the connection of the battery terminal 2 with the battery post 1.

The ring-shaped detector detects a current flowing between the battery B and the load, and a degree of exhaustion of the battery B can be judged based on a detected value.

The above-described current sensor 12 is mounted or mountable on the holder 8 at a position spaced sufficiently from the terminal portion 2A of the battery terminal 2 so that nothing hinders the mounting operation. Thus, the mounting operation can be performed smoothly. Further, the holder 8 and the current sensor 12 can be connected merely by being manually pushed against each other by an operator to engage the locking pieces 13 and the locking projections 11 elastically or resiliently with each other. No tool is required, and the mounting operation is simple.

The current sensor 12 is transported to the connection site without being mounted on the wiring harness 4, and is mounted on the terminal unit TU at the connection site. Therefore, the current sensor 12 will not be damaged while the wiring harness 4 is being handled.

The holder 8 is mounted on the wiring harness 4. Consequently, a terminal with an existing construction can be used as the battery terminal 2.

Various methods besides taping may be adopted to fix the holder 8 to the wiring harness 4, including molding and adhesion.

Figure 4:
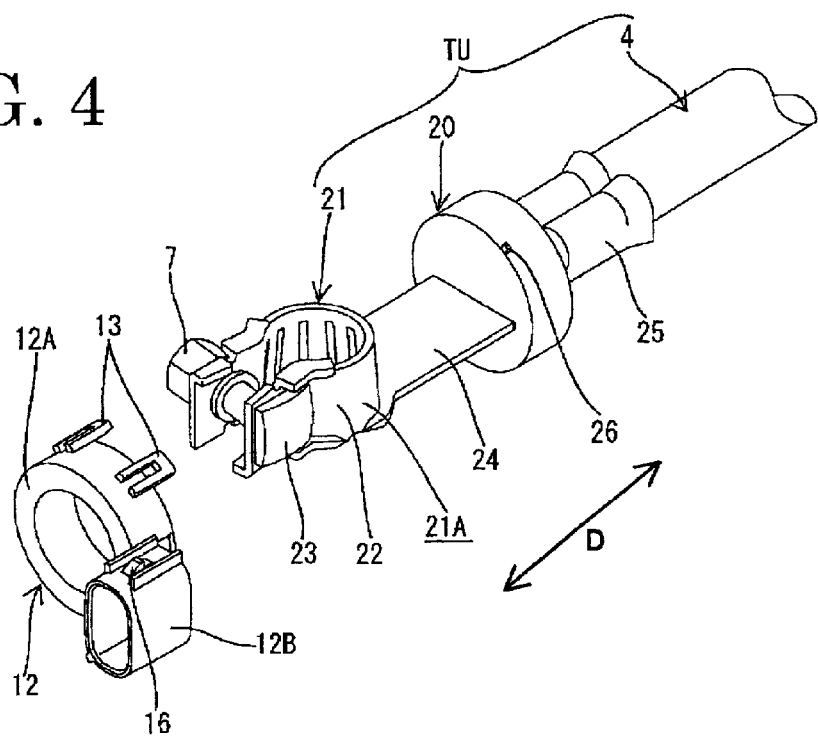
FIG. 4 is an exploded perspective view of a second embodiment.
Figure 5:
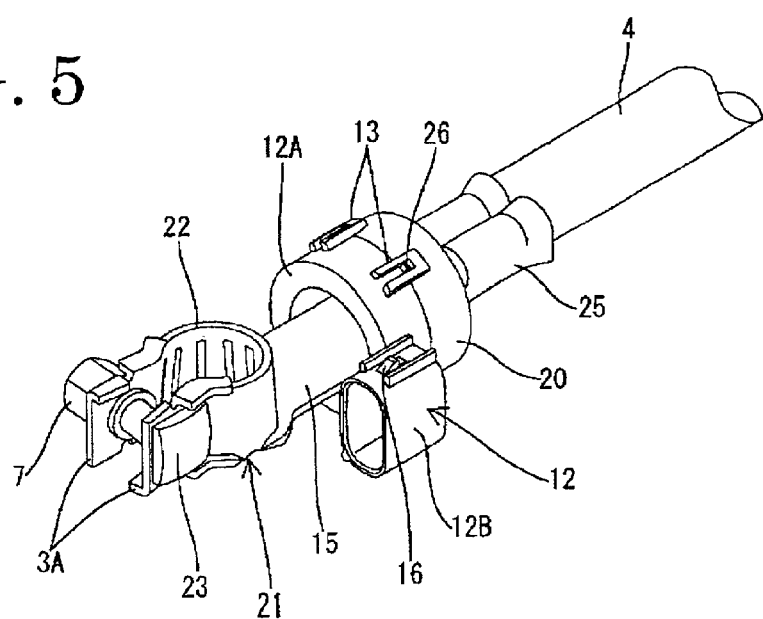
FIG. 5 is a perspective view showing a state where a current sensor is mounted on a terminal unit.

FIGS. 4 and 5 show a second embodiment of the present invention. The second embodiment is identical to the first embodiment in the construction of the current sensor 12. However, the holder 20 of the second embodiment is mounted or mountable on the battery terminal 21.

The battery terminal 21 has a fastening ring 22 with a clamp bolt 23. A substantially planar holder mount 24 extends integrally or unitarily from the bottom edge of a side of a fastening ring 22 substantially opposite the clamp bolt 23. A barrel 25 is provided at the leading end of the holder mount 24 and is connected with a core and an insulation coating of the wire or wiring harness 4 by crimping. A holder 20 made e.g. of a synthetic resin is formed preferably by insert molding at a position on the holder mount 24 near the barrel 25. Alternatively, the holder 20 may be made of two half pieces divided substantially along a diameter. The half pieces may be adhered together or interlocked together with the holder mount 24 arranged therebetween. With any of these options, the holder 20 can be positioned at a selected distance D from the respective terminal portion 21A. The holder 20 is substantially disk-shaped, and locking projections 26 are formed at suitable intervals on its outer circumference.

The holder 20 preferably is formed integrally or unitarily with the battery terminal 21 by insert molding to define a terminal unit TU'. Thus, as in the first embodiment, the current sensor 12 and the terminal unit TU' are transported separately. The current sensor 12 can be fit to the terminal portion 21A of the battery terminal 21 at a connection site to a battery. The sensor portion 12A and the holder 20 then are aligned and moved together to engage the locking pieces 13 and the locking projections 26 with each other, thereby completely mounting the current sensor 12. The fastening ring 22 is fastened to the battery post 1 substantially in the same manner as in the first embodiment thereafter, to complete the connection to the battery.

The current sensor 12 can be mounted at a position spaced sufficiently from the battery B so that nothing hinders the mounting operation. Thus, a smooth operation can be expected. Further, the current sensor 12 is first mounted on the wiring harness 4 prior to connection with the battery B instead of being connected therewith beforehand. Thus, the current sensor 12 will not be damaged while the wiring harness 4 is being handled.

Various changes can be made in the present invention, and a following embodiment is also embraced by the technical scope of the present invention as defined in the claims.

Although the current sensor 12 shown is internally provided with the ring-shaped detector, the shape and mode thereof can be changed in various manners and are not limited to those of the foregoing embodiment.

What is claimed is:

1. A battery terminal unit to be provided with a current sensor (12), comprising a terminal unit (TU: TU') is formed of a wiring harness (4), a battery terminal (2; 21) at a leading end of the wiring harness (4), the battery terminal (2; 21) having at least one terminal portion (2A; 21A) configured for connection with a battery post (1), a holder (8; 20) mountable on one of the wiring harness (4) and the battery terminal (21) at a position spaced a distance (D) from the terminal portion (2A; 21A), and wherein a current sensor (12) is mountable on the holder (8; 20) of the terminal unit (TU; TU').

2. A battery terminal unit according to claim 1, wherein the holder (8) is substantially ring-shaped and is mountable by introducing the wiring harness (4) therethrough.

3. A battery terminal unit according to claim 1, wherein the battery terminal (21) comprises a holder mount portion (24) extending from the terminal portion (21A) toward and connected with the wiring harness (4), the holder (20) being mountable on the holder mount portion (24) at the position spaced from the terminal portion (21A).

4. A battery terminal unit according to claim 3, wherein the holder (8; 20) is formed by two half-pieces configured for arrangement on at least one of the wiring harness (4) and the battery terminal (21) by being fixed interlocked to each other.

5. A battery terminal unit according to claim 3, wherein the holder (20) is formed by insert molding on the holder mount portion (24).

6. A battery terminal unit according to claim 1, wherein the current sensor (12) is configured for coupling to the holder (8; 20) after introducing the terminal portion (2A; 21A) of the battery terminal (2; 21) therethrough.

7. A battery terminal unit according to claim 1, wherein the current sensor (12) is mounted onto the holder (8; 20) by a sensor portion (12A) having locking means (13) configured for engaging a mating locking means (11; 26) of the holder (8; 20).

8. A battery terminal unit according to claim 1, wherein the distance (D) is sufficient for a tightening means (7; 6; 21) of the battery terminal (2; 21) to be tightened so that the battery terminal (2; 21) can be connected to the external battery post (1).

9. A battery terminal unit according to claim 1, wherein the battery terminal (2; 21) comprises a barrel (5; 25) configured for crimped connection with the wiring harness (4).

10. A battery terminal unit according to claim 1, wherein the holder (8; 21) is in the form of a bottomed ring.

11. A battery terminal unit (TU; TU') for use with a current sensor (12) and for connection with a wiring harness (4) and a battery post (1), the battery terminal unit (TU: TU') comprising: a battery terminal (2; 21) having a first end defining a barrel (5; 25) configured for connection with a leading end of the wiring harness (4) and a second end defining a terminal portion (2A; 21A) configured for connection with the battery post (1), and a holder (8; 20) mounted on one of the wiring harness (4) and the battery terminal (21) at a position spaced a distance (D) from the terminal portion (2A; 21A), the holder (8; 20) being configured for receiving the current sensor (12).

12. A battery terminal unit according to claim 11, wherein the holder (8) is substantially ring-shaped and is dimensioned introducing the wiring harness (4) therethrough.

13. A battery terminal unit according to claim 11, wherein the battery terminal (21) comprises a holder mount portion (24) extending from the barrel (25) to the terminal portion (21A), the holder (20) being mountable on the holder mount portion (24) at the position spaced from the terminal portion (21A).

14. A battery terminal unit according to claim 13, wherein the holder (20) is formed by insert molding on the holder mount portion (24).

15. A battery terminal unit according to claim 11, wherein the current sensor (12) is configured for coupling to the holder (8; 20) after introducing the terminal portion (2A; 21A) of the battery terminal (2; 21) therethrough.

16. A battery terminal unit according to claim 11, wherein the current sensor (12) is mounted onto the holder (8; 20) by a sensor portion (12A) having a lock (13) configured for engaging a mating lock (11; 26) of the holder (8; 20).

17. A battery terminal unit (TU; TU') for connection with a wiring harness (4) and a battery post (1), the battery terminal unit (TU: TU') comprising: a battery terminal (2; 21) having a first end defining a barrel (5; 25) configured for connection with a leading end of the wiring harness (4) and a second end defining a terminal portion (2A; 21A) configured for connection with the battery post (1), and a holder (8; 20) mounted on one of the wiring harness (4) and the battery terminal (21) at a position spaced a distance (D) from the terminal portion (2A; 21A), a current sensor (12) mounted to the holder (8; 20).

* * * * *